(12) United States Patent
Ito et al.

(10) Patent No.: US 6,521,822 B2
(45) Date of Patent: Feb. 18, 2003

(54) ELECTRONIC UNIT

(75) Inventors: Yukio Ito, Nishitokyo (JP); Junsuke Kashikie, Nishitokyo (JP); Teruhiko Fujii, Nishitokyo (JP)

(73) Assignee: Citizen Watch Co., Ltd., Tokyo (JP)

( * ) Notice: Subject to any disclaimer, the term of this patent is extended or adjusted under 35 U.S.C. 154(b) by 0 days.

(21) Appl. No.: 09/959,096

(22) PCT Filed: Mar. 16, 2001

(86) PCT No.: PCT/JP01/02091
§ 371 (c)(1),
(2), (4) Date: Oct. 18, 2001

(87) PCT Pub. No.: WO01/71434
PCT Pub. Date: Sep. 27, 2001

(65) Prior Publication Data
US 2002/0157700 A1 Oct. 31, 2002

(30) Foreign Application Priority Data

Mar. 21, 2000 (JP) ......................................... 2000-078920
Sep. 28, 2000 (JP) ......................................... 2000-295941

(51) Int. Cl.⁷ ......................... G04C 10/02; H01L 31/04; G04B 39/00; G04B 43/00; G04G 17/06
(52) U.S. Cl. ...................... 136/244; 136/251; 136/291; 368/205; 368/88; 368/80; 368/82
(58) Field of Search ................. 136/244, 251, 136/291; 368/205, 88, 80, 82

(56) References Cited

U.S. PATENT DOCUMENTS 6,020,943 A  *  2/2000  Sonoda et al. ................ 349/61
6,122,226 A  *  9/2000  Murakami et al. ............ 368/80
6,372,977 B1  *  4/2002  Miyoshi ..................... 136/246

FOREIGN PATENT DOCUMENTS

| CN | 1173687 | 2/1998 |
| JP | 57-94964 | 12/1980 |
| JP | 56-77885 | 6/1981 |
| JP | 10-270735 A | * 10/1988 |
| JP | 63-181989 | 11/1988 |
| JP | 7-287081 | 10/1995 |
| JP | 2000-162342 | 6/2000 |
| JP | 2000-187205 | 7/2000 |
| JP | 2000-221282 | 8/2000 |
| WO | WO-00/28513 A1 | * 5/2000 |

* cited by examiner

Primary Examiner—Alan Diamond
(74) Attorney, Agent, or Firm—Kanesaka & Takeuchi

(57) ABSTRACT

In an electronic device having a solar cell and a unit driven by a power generated by the solar cell, the solar cell 10 includes a transparent substrate 12; a plurality of conductive portions 14a to 14d provided around the transparent substrate 12 and connected in series; and a plurality of photocells 18, each having a thin-line shape, formed at proper intervals on the transparent substrate 12 and connected to the conductive portions 14a to 14d. By forming a transparent electrode film 80 on the transparent substrate 12 and by connecting the transparent electrode film 80 to the ground, an adverse influence of static electricity is prevented.

37 Claims, 11 Drawing Sheets

ELECTRONIC UNIT

TECHNICAL FIELD

The present invention relates to an electronic device having a solar cell and a unit driven by a power generated by the solar cell and, more particularly, an electronic device which can be realized with various designs by using a transparent solar cell having thin-line-shaped photocells.

BACKGROUND ART

An electronic device having therein a solar cell and a unit which operates on the solar cell as a power source is well known.

Since a photocell for receiving light and generating a power in the solar cell is usually made of an opaque material such as a fuscous material, the solar cell cannot be provided on a digital display member and an analog display member.

Consequently, when the solar cell is mounted on an electronic device having the digital or analog display member, it has to be mounted by avoiding the display member. Due to this, the electronic device may look unattractive and, moreover, is limited in designing.

A technique of solving such a problem by using a transparent solar cell achieved by forming thin-line-shaped photocells at regular intervals on a transparent substrate is known by, for example, the publication of Japanese Utility Model Application Laid-Open No. 57-94964.

The solar cell disclosed in the publication is obtained by etching photocells to be sufficiently narrow on a transparent substrate so that the solar cell looks transparent within a visual range of a human.

In the electronic device disclosed in the publication, however, the solar cell is constructed by forming a single photocell in one stroke on a transparent substrate, so that the sufficient power necessary to operate the electronic device cannot be substantially obtained from the solar cell. The electronic device has not therefore been realized yet.

In recent years, skeleton products which are see-through are in fashion. A watch which looks more transparent is also in demand from a fashion viewpoint.

It is however difficult for a conventional watch using a solar cell to address the above-described demand for a reason of property that the solar cell is opaque and a reason of function that sufficient electromotive force cannot be obtained when an effective area of the solar cell is reduced.

Moreover, in the solar cell, photocells are constructed by stacking thin films of silicon or the like. Consequently, when static electricity of a few thousand volts (V) built up on a human body or the like is directly applied to the photocells, there is a fear such that a pin hole, burn, or the like occurs due to internal discharge and a circuit device is destroyed by short circuit.

The present invention has been achieved in consideration of the above problems. An object of the present invention is to provide an electronic device with largely improved flexibility in designing the electronic device to satisfy the user's fashion mind by using a solar cell having improved transparency by making photocells extremely narrowed and capable of obtaining an electromotive force sufficient to operate the electronic device, and to provide a durable electronic device which is protected from external environments such as static electricity built on a human body or the like by forming a transparent electrode film on or near the surface of a photocell.

DISCLOSURE OF THE INVENTION

In order to solve the problems, according to the invention, in an electronic device having a solar cell and a unit driven by a power generated by the solar cell, the solar cell is a translucent solar cell including a transparent cell substrate; a plurality of conductive portions provided around the cell substrate and connected in series; and a plurality of photocells, each having a thin-line shape, formed at proper intervals on the cell substrate and connected to the conductive portions.

With the configuration, by forming the plurality of thin-line-shaped photocells on the cell substrate at proper intervals, the photocells are suppressed from being visually recognized, so that a transparent solar cell can be obtained. The intervals of the photocells are preferably regular intervals. With the configuration, a solar cell having higher transparency can be obtained.

Moreover, by connecting the plurality of conductive portions in series and connecting the photocells to the conductive portions, sufficient electromotive force necessary to operate the electronic device can be obtained.

The photocell having a thin-line shape is formed so as to extend from one of the conductive portions in a direction crossing the cell substrate, close to the other conductive portion, thereby limiting the portion in which no photocell is formed to an extremely small area in the periphery of the cell substrate. Thus, irregular color of the translucent solar cell can be lessened.

By using the translucent solar cell as described above, the solar cell can be disposed above the display member of the electronic device, so that the flexibility in designing can be increased.

The display member may be a liquid crystal display. The liquid crystal display may be provided on the back of the cell substrate or formed integrally with the translucent solar cell.

It is also possible to dispose the translucent solar cell on the upper side of a casing of the electronic device, dispose the unit driven by the power generated by the solar cell below the translucent solar cell in the casing, create a space between the unit and the casing, and dispose a transparent member under the electronic device, so that the electronic device is see-through.

In this case, the translucent solar cell may be also disposed on the lower side of the casing, or the translucent solar cell may be disposed only on the lower side of the casing.

By using the invention to a timepiece, the improved flexibility in designing the timepiece can be obtained.

The timepiece may be an analog or digital timepiece.

By using the translucent solar cell, the solar cell can be provided above the pointers of the analog timepiece.

The scales of a dial of an analog timepiece may be provided on the surface or back of the cell substrate.

In the timepiece as well, the translucent solar cell is disposed on the surface of a casing of the timepiece, the pointers of the analog display member and the movement for driving the pointers are disposed below the translucent solar cell in the casing, a space is created between the movement and the casing, and a transparent plate is disposed on the under face side of the timepiece, so that the timepiece can be see-through.

In this case, the cell substrate can be formed in a size so as to cover the movement and the space.

Moreover, the translucent solar cell may be disposed not only on the surface of the casing but also the back side of the casing, or the translucent solar cell may be disposed only on the back side of the casing.

Further, the casing and the movement may be coupled to each other via one or a plurality of ribs, and the movement is supported on the center side of the casing.

In this case, preferably, a conductive member for supplying the power from the translucent solar cell to the movement through the inside of the rib is disposed.

Particularly, it is preferable to construct in such a manner that the conductive portion of the cell substrate and the conductive member are connected to each other via a connection member, and this connection member has a first contact portion abutted against an output terminal of the conductive portion, and a second contact portion abutted against the conductive member.

By using such a connection member, the assembly of the solar cell is facilitated, and the solar cell and the conductive member can be connected to each other with reliability.

Preferably, at least a minute hand indicating minute(s) out of the pointers of the analog display member is extended to a position above the space created between the casing and the movement. With the configuration, the time can be known also from the back side of the timepiece.

According to the present invention, a transparent electrode film is formed on or near the cell substrate, and the transparent electrode film is connected to the ground of the unit.

Further, the transparent electrode film is formed on the side opposite to a face on which a photocell is formed of the cell substrate, the transparent electrode film is formed on a substrate face opposite to a face on which a photocell is formed of the cell substrate, or the transparent electrode film is formed on the side of a face on which a photocell is formed of the cell substrate. The transparent electrode film is a transparent thin ITO film and is grounded to the casing via the conductive member.

With the configuration, the electronic device can be protected from external environments such as static electricity built on a human body, so that a durable electronic device can be provided.

BEST MODE FOR CARRYING OUT THE INVENTION

Preferred embodiments of the present invention will be described in detail with reference to the drawings.

Figure 1:
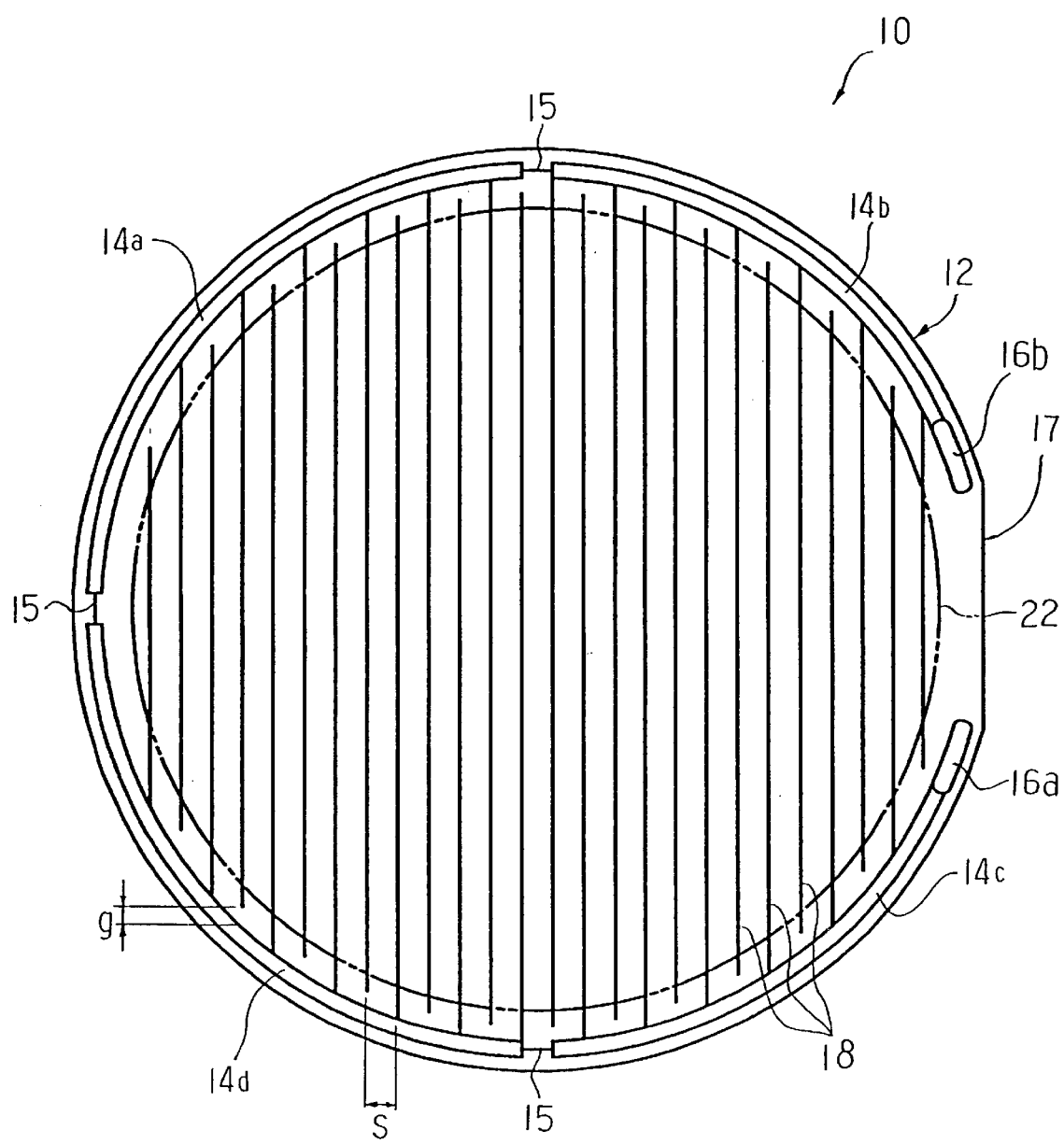
FIG. 1 is a plan view of a translucent solar cell used for an electronic device of the present invention.

FIG. 1 is a plan view of a translucent solar cell used for an electronic device according to a first embodiment of the present invention.

A translucent solar cell 10 (hereinafter, described as solar cell 10) is formed by using a transparent substrate 12 having high transparency such as glass or acrylic plate as a base material. Although the solar cell 10 shown in FIG. 1 uses the circular-shaped transparent substrate 12 as a base material, various shapes such as circle, oval, rectangle, polygon, and undefined shape can be used for the transparent substrate 12 according to the shape of a display member 22 (indicated by an imaginary line in FIG. 1) of the electronic device using the solar cell 10.

On the surface of the transparent substrate 12, a plurality of (four in the embodiment) conductive portions 14a, 14b, 14c, and 14d are disposed along the periphery. The four conductive portions 14a to 14d are connected in series via connection parts 15. Output terminals 16a and 16b for taking power from the solar cell 10 are formed at ends of the conductive portions 14c and 14b positioned at both ends out of the four conductive portions 14a to 14d. The conductive portions 14a, 14b, 14c, and 14d are preferably disposed on the outer side of the display member 22 of the electronic device using the solar cell 10.

The conductive portions 14a to 14d and the connection parts 15 can be formed by etching a thin conductive film of copper, aluminum, or the like on the transparent substrate 12. They can be also formed by adhering thin foil such as copper foil or aluminum foil on the transparent substrate 12. They can be also formed by applying a transparent conductive material in place of copper, aluminum, or the like on the transparent substrate 12.

On the surface of the transparent substrate 12, a plurality of linear photocells 18 are formed in parallel with each other so as to extend from one of the neighboring conductive portions 14a and 14d or the neighboring conductive portions 14b and 14c (for example, conductive portion 14a) via the transparent substrate 12 to the other corresponding conductive portion (for example, conductive portion 14d). Although the photocells 18 may be formed at irregular intervals, in the embodiment, in order to increase transparency of the solar cell 10, the photocells 18 are formed at regular intervals S. Preferably, the interval S and line width of each of the photocells 18 with respect to the interval S are set so as to make the photocells 18 inconspicuous in the appearance, thereby increasing the transparency of the solar cell 10 and to be able to obtain the electromotive force necessary to operate the electronic device on the solar cell 10. For example, the interval is approximately 0.1 mm and the line width with respect to the interval S is in a range from 3% to 30%, preferably, 5% to 20%.

Although the photocells 18 shown in FIG. 1 are formed linearly in parallel with each other, the present invention is not limited to the form, but the photocells 18 can be formed in various forms such as wave shape, radial shape, semicircular shape, and ladder shape. It is preferable to select the optimum form of the photocell 18 in consideration of the shape of the transparent substrate 12, electromotive force necessary to operate the electronic device, and the like.

One end of the photocell 18 is connected to one of the two conductive portions 14c and 14d or conductive portions 14a and 14b on a line extended from the photocell 18. Preferably, the photocells 18 are connected to the conductive portions 14a, 14b, 14c, and 14d so that the electromotive forces of the respective conductive portions 14a, 14b, 14c, and 14d are equal to each other. For example, as shown in FIG. 1, it is preferable to alternately dispose the photocells 18 connected to the conductive portions 14c and 14d or conductive portions 14a and 14b so that the total areas of the photocells 18 connected to the conductive portions 14a, 14b, 14c, and 14d are equal to each other.

When a voltage generated by the photocells 18 connected to one of the conductive portions 14a, 14b, 14c, and 14d is approximately 0.4V to 0.6V, by connecting the four conductive portions 14a, 14b, 14c, and 14d in series, a voltage of approximately 1.6V to 2.4V sufficient to drive the electronic device can be obtained.

By providing a plurality of conductive portions to which the photocells 18 are connected and connecting the conductive portions in series, a voltage sufficient to operate the electronic device can be obtained.

The other end of the photocell 18 extends close to the other conductive portion on the extended line. For example, a photocell 18 whose one end is connected to the conductive portion 14a crosses the transparent substrate 12 and the display member 22 of the electronic device and extends to just before the conductive portion 14d opposite to the conductive portion 14a. A gap "g" between the other end of the photocell 18 and the other conductive portion is preferably as narrow as possible for the reason that, since the gap "g" is a portion in which no photocell 18 is formed and transparency is high, when the gaps "g" having high transparency are gathered in the periphery of the transparent substrate 12, irregular color is apt to occur in the solar cell 10.

Figure 2:
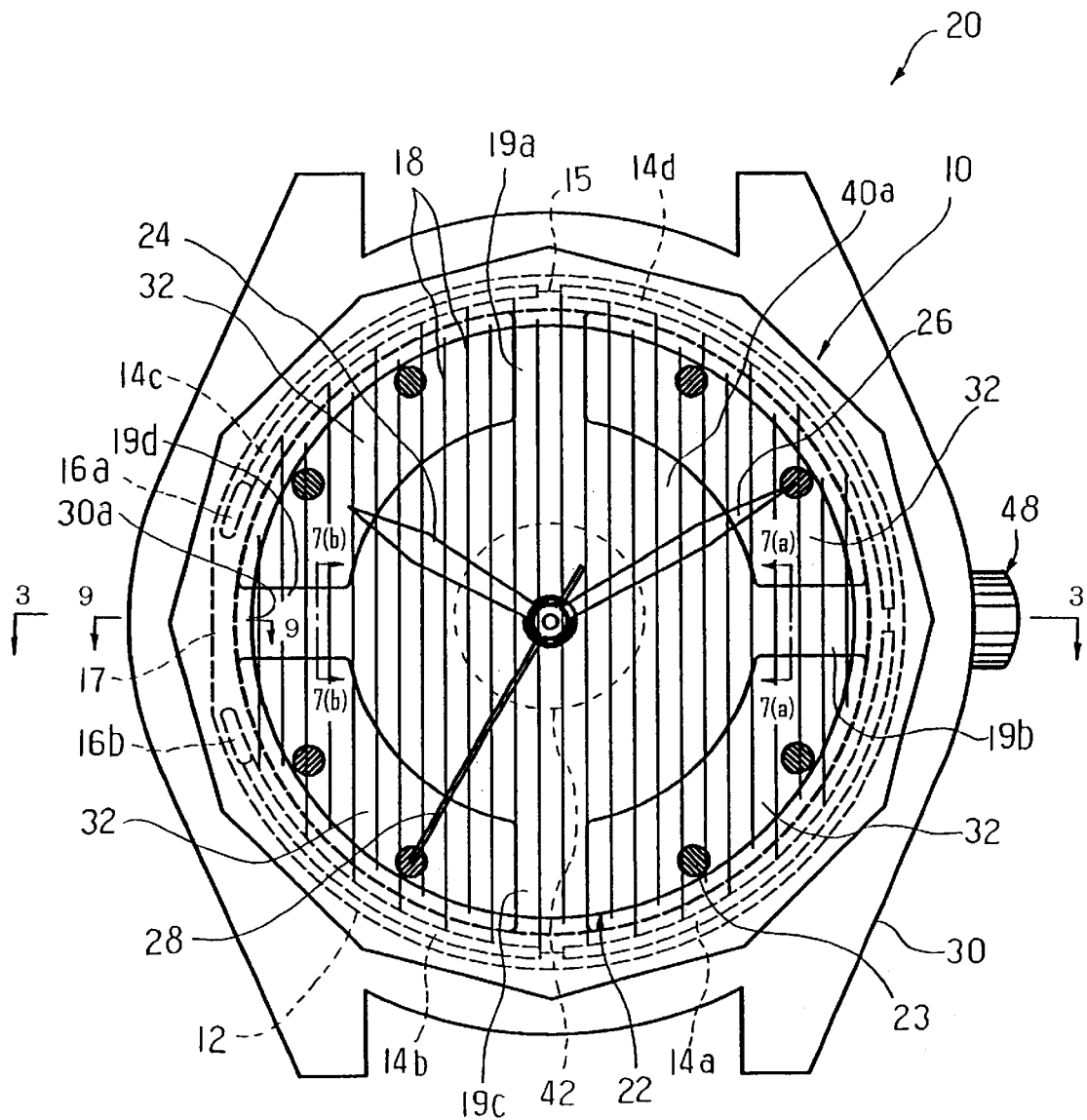
FIG. 2 is a plan view of a watch according to an embodiment in which the solar cell of FIG. 1 is used for a watch as an example of the electronic device.

FIG. 2 is a plan view of a watch according to an embodiment in which the solar cell 10 having the above configuration is used for a watch as an example of the electronic device.

The display member 22 of the watch 20 is an analog display member having pointers and a dial.

The display member 22 is constructed by pointers which are a hour hand 24 indicative of hour(s) a minute hand 26 indicative minute(s), and a second hand 28 indicative of second(s), and a dial having scales 23 constructed by characters, patterns or the like for indicating time disposed along the periphery of the display member 22.

In the embodiment, the solar cell 10 of FIG. 1 is attached to the watch 20 with its surface facing downward. Specifically, the solar cell 10 is attached to the watch 20 in a state where the surface on which the conductive portions 14a, 14b, 14c, and 14d and the photocells 18 are formed faces downward. The solar cell 10 of the embodiment is formed to be larger than the display member 22 of the watch 20. The conductive portions 14a to 14d of the solar cell 10 are hidden by a panel cover 30a so as not to be easily seen from the outside. The panel cover 30a is formed so as to project to the inside of an exterior casing 30.

In the watch 20 of the embodiment, the scales 23 showing the time are etched, printed or the like on the back side of the transparent substrate 12 as a component of the solar cell 10. In the embodiment, therefore, the dial of the analog display member is formed by the back face of the transparent substrate 12 and the scales 23. Obviously, the scales 23 are not limited to be formed on the back face of the transparent substrate 12 but may be formed on the surface. It is also possible to form the scales 23 by photocells.

A movement 42 for driving the hour hand 24, minute hand 26, and second hand 28 is disposed in the center of the watch 20 and is supported by four rib parts 19a, 19b, 19c, and 19d extended from the inner circumference face of the exterior casing 30. The rib parts 19a, 19b, 19c, and 19d are provided in positions where the hour hand 24 indicates 12 o'clock, 3 o'clock, 6 o'clock, and 9 o'clock, respectively, and are a part of the display member 22 of the watch 20.

As long as the movement 42 can be supported in the center of the watch 20, the number of ribs is not limited to four but may be one to three or five or larger.

Between the rib parts 19a, 19b, 19c, and 19d, four space portions 32 extending in the radial direction of the watch 20 and penetrating in the perpendicular direction are formed. In the watch 20, by using a transparent substrate such as a glass plate as a back, the watch 20 can be seen through the space portions 32 from the upper side to the lower side (or from the lower side to the upper side).

The details of the watch 20 will be described by referring to FIG. 3 and FIGS. 4 to 6.

Figure 3:
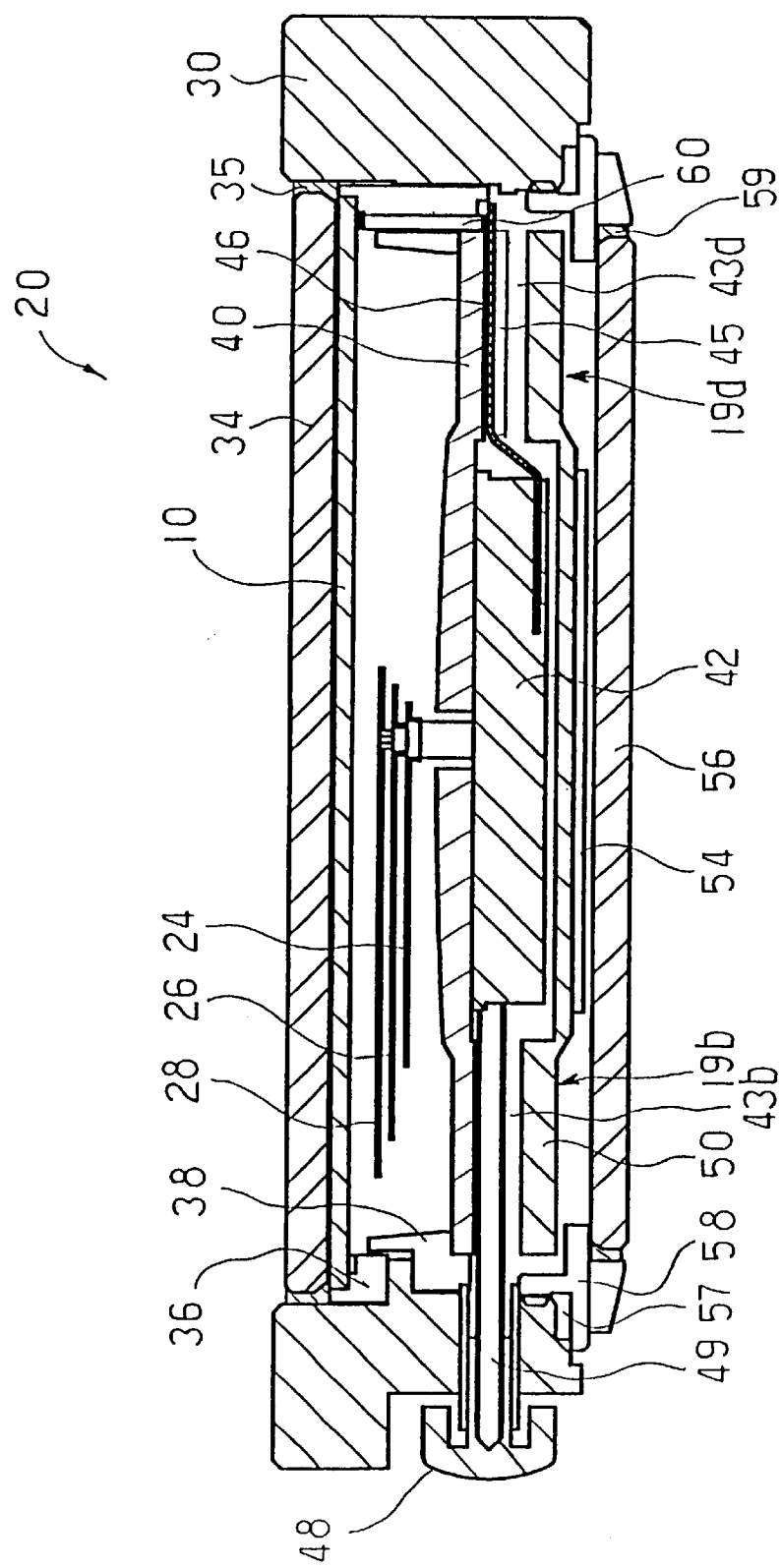
FIG. 3 is a sectional view taken along line 3–3 of FIG. 2.
Figure 4:
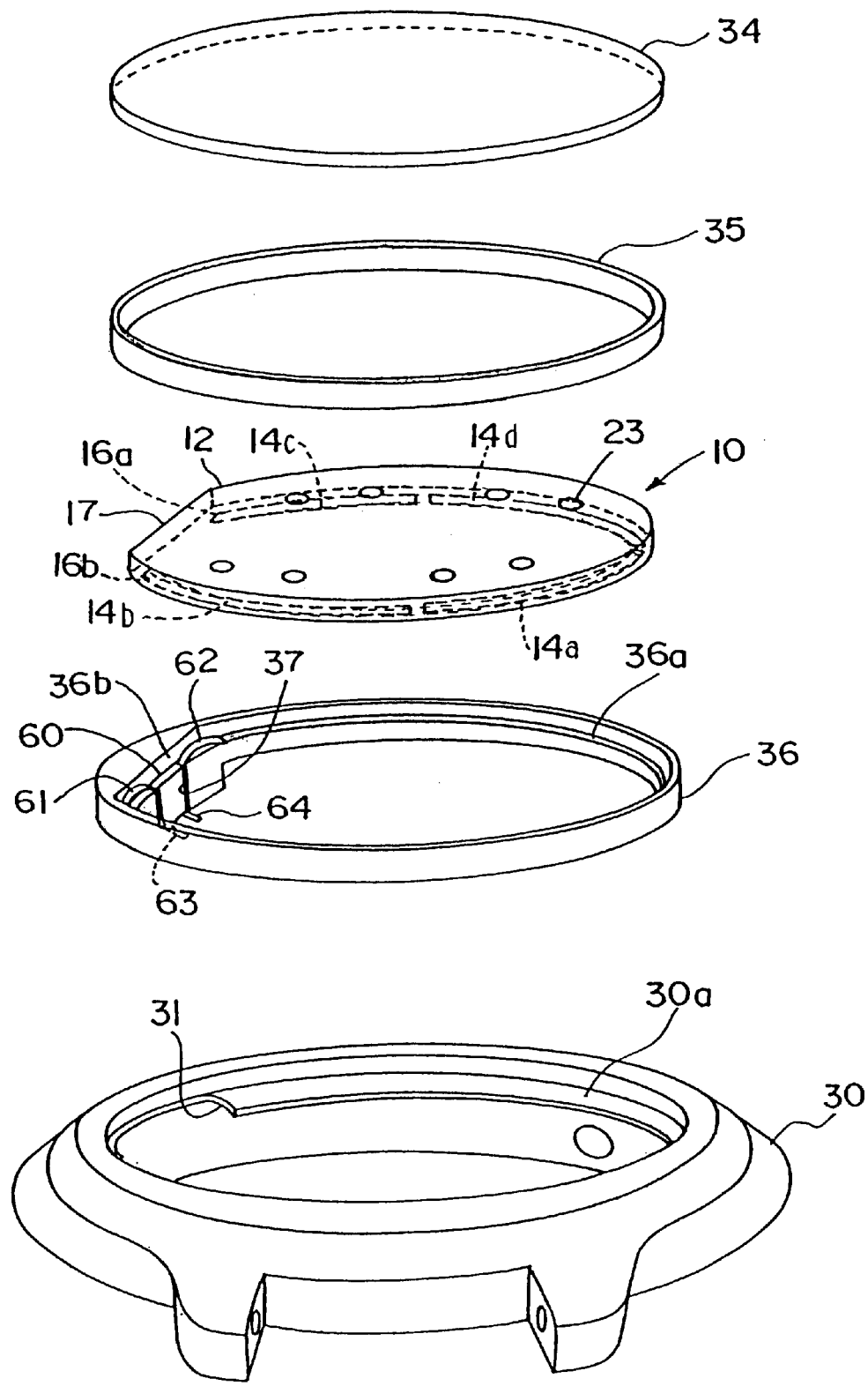
FIG. 4 is an exploded perspective view of the watch of FIG. 2, showing members assembled in the upper part of an exterior casing.
Figure 5:
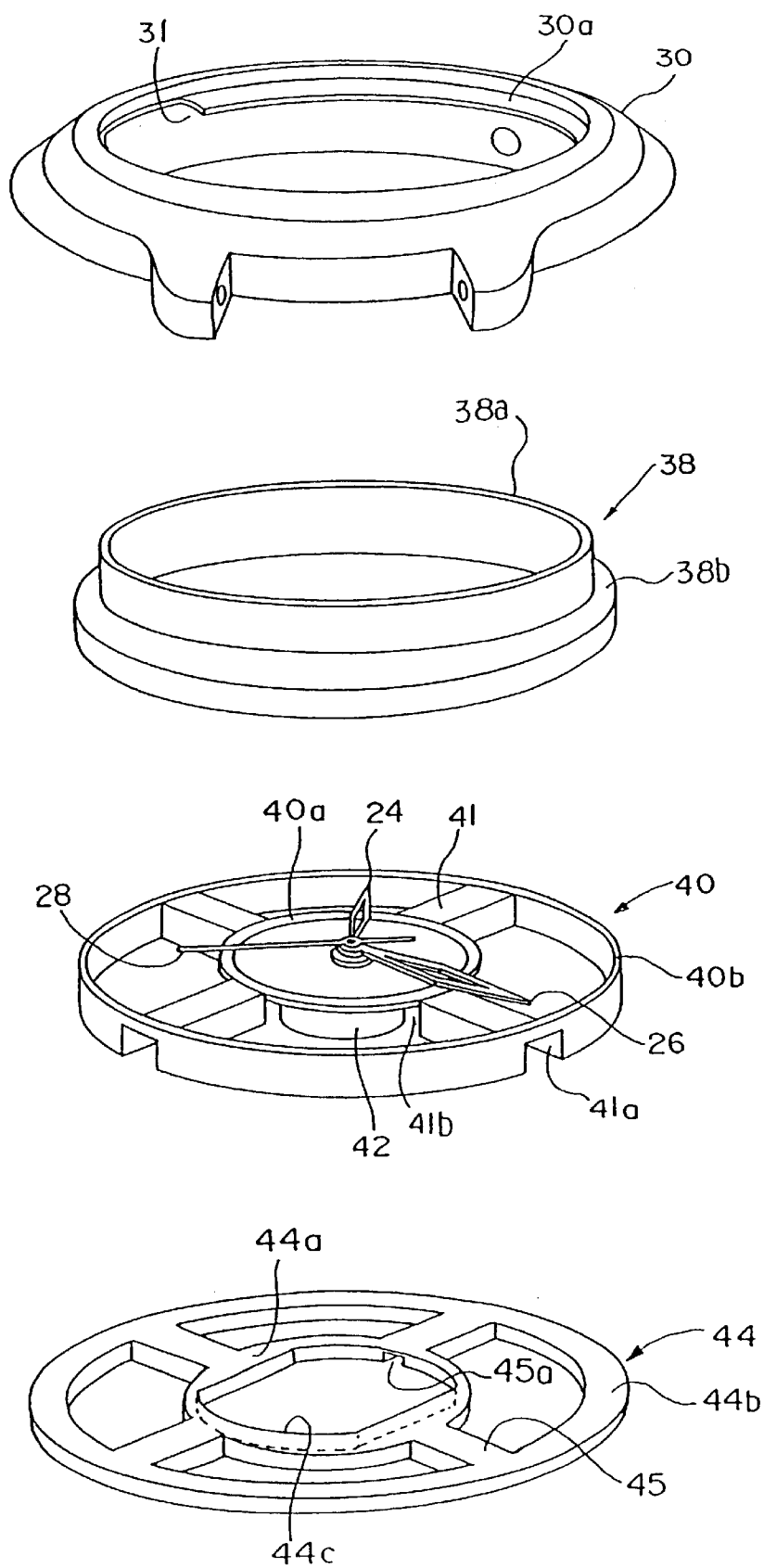
FIG. 5 is an exploded perspective view of the watch of FIG. 2, showing a cover ring and a movement supporting member assembled in the lower part of the exterior casing.
Figure 6:
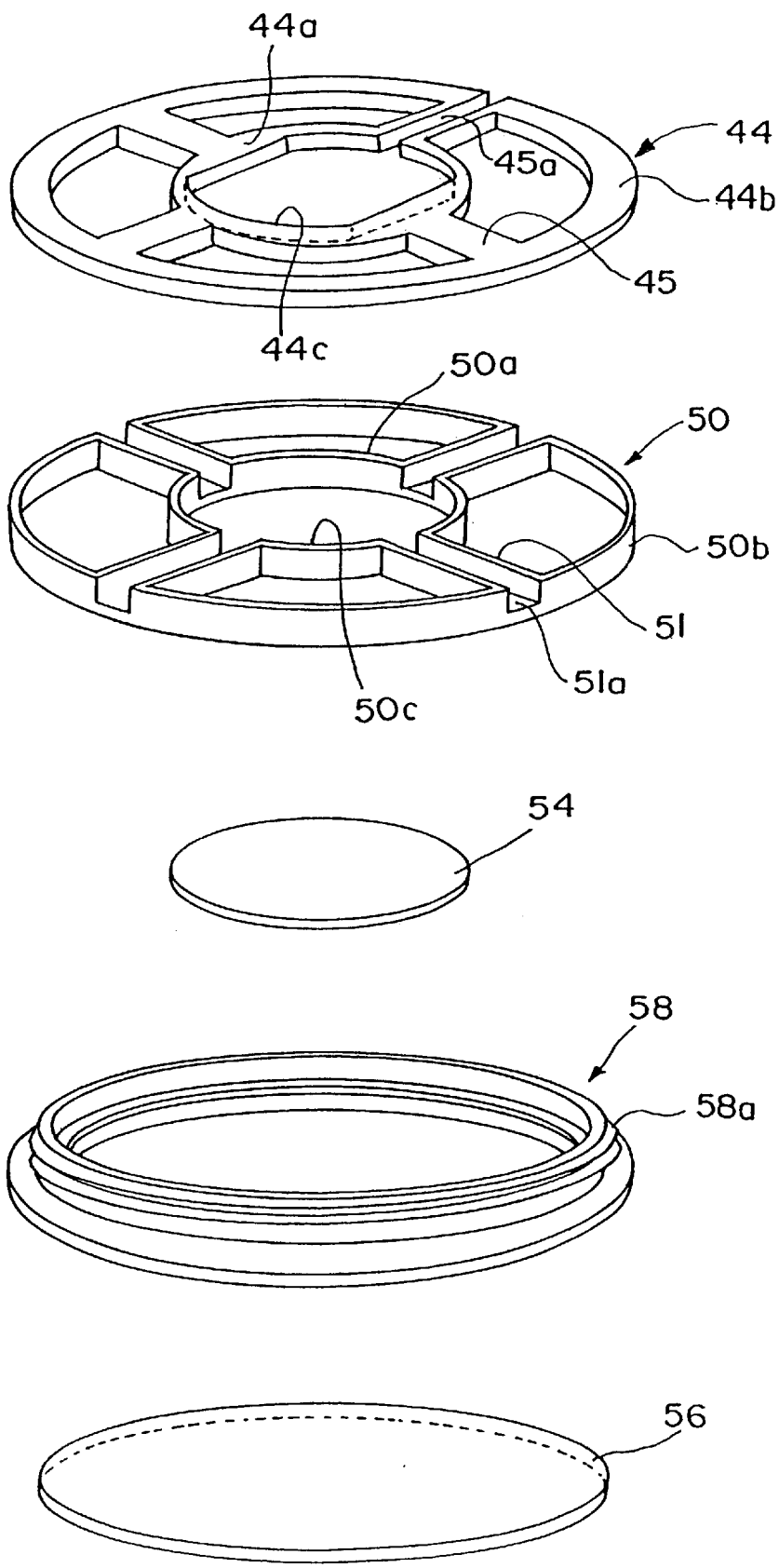
FIG. 6 is an exploded perspective view of the watch of FIG. 2, showing the other members assembled in the lower part of the exterior casing.

FIG. 3 is a sectional view taken along line 3—3 of FIG. 2 of the watch, and FIGS. 4 to 6 are exploded perspective views of the watch.

As shown in FIGS. 3 and 4, in the upper part of the exterior casing 30, a windshield 34, a packing 35, the solar cell 10, and a solar cell holding member 36 are attached.

In the lower part of the exterior casing 30, as shown in FIGS. 3, 5, and 6, a windshield 56 as a back, a pressing member 58, a movement holding member 50, a casing ring 44, a movement supporting member 40, and a cover ring 38 are attached.

Hereinafter, the members attached in the upper part of the exterior casing 30 will be described first in detail one by one.

On the back face (upper face in FIG. 3) of the transparent substrate 12, the scales 23 for indicating time as a component of the dial of the watch 20 are preliminarily formed by printing, marking, adhering or the like. The solar cell 10 is held by the ring-shaped solar cell holding member 36 and is fit in the exterior casing 30 from above. On the inner face of the solar cell holding member 36, a stepped receiving portion 36a which engages with the periphery of the solar cell 10 to receive the solar cell 10 is formed. When the solar cell 10 is fit into the solar cell holding member 36 from above, the periphery of the solar cell 10 engages with the receiving portion 36a and is held by the solar cell holding member 36.

A notch 17 as a detent is formed in a part of the outer periphery of the solar cell 10, and a notch engagement portion 36b to engage with the notch 17 is formed in the solar cell holding member 36. By fitting the solar cell 10 to the solar cell holding member 36 so that the notch 17 engages with the notch engagement portion 36b, the solar cell 10 is prevented from rotating with respect to the solar cell holding member 36.

In a portion where the notch engagement portion 36b of the solar cell holding member 36 is formed, a groove 37 penetrating the receiving portion 36a to the other side of the solar cell holding member 36 is formed. In the groove 37, a connection member 60 for supplying the power of the solar cell 10 to the movement 42 and the like is disposed. On one side of the connection member 60, two contacts 61 and 62 are provided as a first contact portion pressed against the output terminals 16a and 16b (refer to FIG. 1) formed in the conductive portions 14c and 14b of the solar cell 10 when the solar cell 10 is assembled on the inside of the exterior casing 30 together with the solar cell holding member 36. Each of the contacts 61 and 62 is formed in a plate spring shape so as to assure the state of contact with the output terminals 16a and 16b with reliability to guarantee the supply of power from the solar cell 10 to the movement 42.

On the other side of the connection member 60, a contact 63 to be conductive with the contact 61 and a contact 64 to be conductive with the contact 62 are provided. Each of the contacts 63 and 64 is formed in a plate spring shape so as to be in contact with reliability in a state where they are pressed against not-illustrated input terminals on the positive and negative sides formed in a part of a conduction pattern 46. By forming each of the contacts 61 to 64 in a plate spring shape, the solar cell 10 and the conduction pattern 46 can be connected to each other with reliability and, moreover, the connection state can be maintained even if the watch 20 is largely shocked.

The above-described groove 37 and the connection member 60 are hidden so as not to be seen from the outside by the cover ring 38, which will be described hereinafter, fit in the solar cell holding member 36.

On the inside of the exterior casing 30, a flange-shaped receiving portion 30a is formed. When the solar cell holding member 36 holding the solar cell 10 is fit in the exterior casing 30 from above, the solar cell holding member 36 is supported in the exterior casing 30 by the receiving portion 30a. Then the packing 35 is placed on the solar cell 10, and the windshield 34 is fit in the exterior casing 30 via the packing 35 and fixed. Obviously, the windshield 34 may be fixed to the exterior casing 30 by adhesive or the like. In such a manner, the upper portion of the watch 20 is completed.

Next, the members attached to the lower portion of the exterior casing 30 will be described.

The cover ring 38 has a cover portion 38a which is fit in the solar cell holding member 36 and hides the inner face of the solar cell holding member 36, and a flange portion 38b having an outside diameter almost the same as that of the inner face of the exterior casing 30. When the cover ring 38 is inserted in the exterior casing 30 from below, the outer face of the flange portion 38b comes into contact with the inner face of the exterior casing 30, thereby positioning the cover ring 38 in the watch 20.

The ring-shaped movement supporting member 40 for supporting the movement 42 is disposed under the cover ring 38. The movement supporting member 40 includes an outer ring portion 40b having an outside diameter slightly smaller than the inside diameter of the exterior casing 30 and a disk-shaped supporting portion 40a for supporting the movement 42. The surface of the supporting portion 40a is finished in a manner similar to the dial of an ordinary watch. The diameter of the supporting portion 40a is preferably smaller than, at least, the length of the minute hand 26 of the watch 20 and, more preferably smaller than the length of the hour hand 24.

The supporting portion 40a and the outer ring portion 40b are coupled to each other via four ribs 41 formed in the positions of 12 o'clock, 3 o'clock, 6 o'clock, and 9 o'clock of the watch 20. The sectional shape of the rib 41 is an inverted U shape. The portion of the inverted U shape serves as a path 41a.

As long as the supporting portion 40a and the outer ring portion 40b can be securely coupled to each other, the number of the ribs 41 is not limited to four, but can be one to three, or five or more. The positions in which the ribs 41 are provided are not limited to the above positions but arbitrary proper positions can be selected in consideration of design of the watch 20 and the like.

The casing ring 44 attached from below to the movement supporting member 40 has an inner ring portion 44a having a movement fitting portion 44c in which the movement 42 is to be fit, an outer ring portion 44b formed around the inner ring portion 44a, and ribs 45 for coupling the inner ring portion 44a and the outer ring portion 44b. The outer shape of the inner ring portion 44a is formed so as to be fit in a gap 41b between the movement 42 attached to the under face of the supporting portion 40a of the movement supporting member 40 and the ends of ribs 41.

Moreover, the outer ring portion 44b is formed in a size to be in contact with the inner face of the exterior casing 30 and in contact with the outer ring portion 40b of the movement supporting member 40. The ribs 45 are formed so as to be fit in the path 41a of the ribs 41 of the movement supporting member 40. In the rib 45 positioned in three o'clock of the watch 20 out of the four ribs 45 of the casing ring 44, an inverted U-shaped path 45a through which a winding stem 49 of a crown 48 can be inserted is formed.

The movement holding member 50 has an outer ring portion 50b having the same outer shape as that of the outer ring portion 40b of the movement supporting member 40, a hole 50c to which the inner ring portion 44a of the casing ring 44 is fit, and an inner ring portion 50a having the same outside diameter as that of the supporting portion 40a of the movement supporting member 40. The inner ring portion 50a and the outer ring portion 50b are coupled to each other via four ribs 51 provided in the same positions as the ribs 41 of the movement supporting member 40. The sectional shape of the rib 51 is a U shape, and the U-shaped portion serves as a path 51a to which the rib 45 of the casing ring 44 is fit.

The movement supporting member 40 and the movement holding member 50 formed as described above are overlapped with each other with the casing ring 44 sandwiched therebetween. Specifically, in a state where the rib 45 of the casing ring 44 is positioned in the path 41a of the movement supporting member 40 and the path 51a of the movement holding member 50, the inner ring portion 44a of the casing ring 44 is fit in the gap 41b (refer to FIG. 5) of the movement supporting member 40 and the hole 50c of the inner ring portion 50a of the movement holding member 50. By the operation, the outer ring portion 40b of the movement supporting member 40 and the outer ring portion 50b of the movement holding member 50 are fit on the inside of the outer ring portion 44b of the casing ring 44.

The ribs 41 of the movement supporting member 40, ribs 45 of the casing ring 44, and ribs 51 of the movement holding member 50 form the rib parts 19a to 19d of the watch 20. Moreover, the path 41a of the movement supporting member 40 and the path 51a of the movement holding member 50 in the position of 3 o'clock of the watch 20 form an inner path 43b (refer to FIG. 3) in the rib part 19b, and the paths 41a and 51a in the position of 9 o'clock form an inner path 43d of the rib part 19d.

Figure 7A:
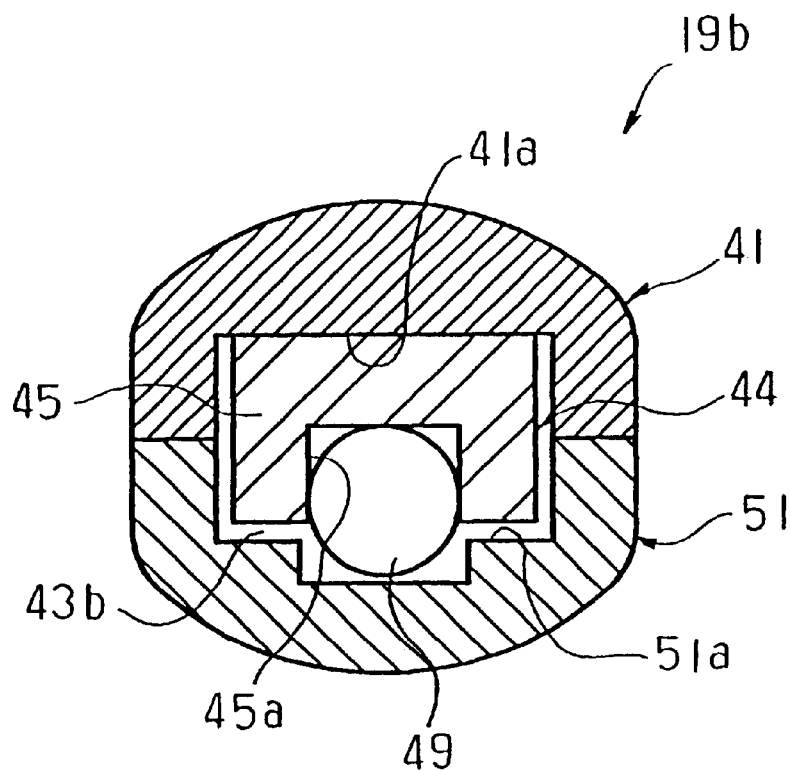
FIGS. 7(a) and 7(b) are sectional views taken along line 7(a)—7(a) and line 7(b)—7(b) of FIG. 2, respectively, of a rib portion in a state where the movement supporting member, a casing ring, and a movement holding member are assembled.
Figure 7B:
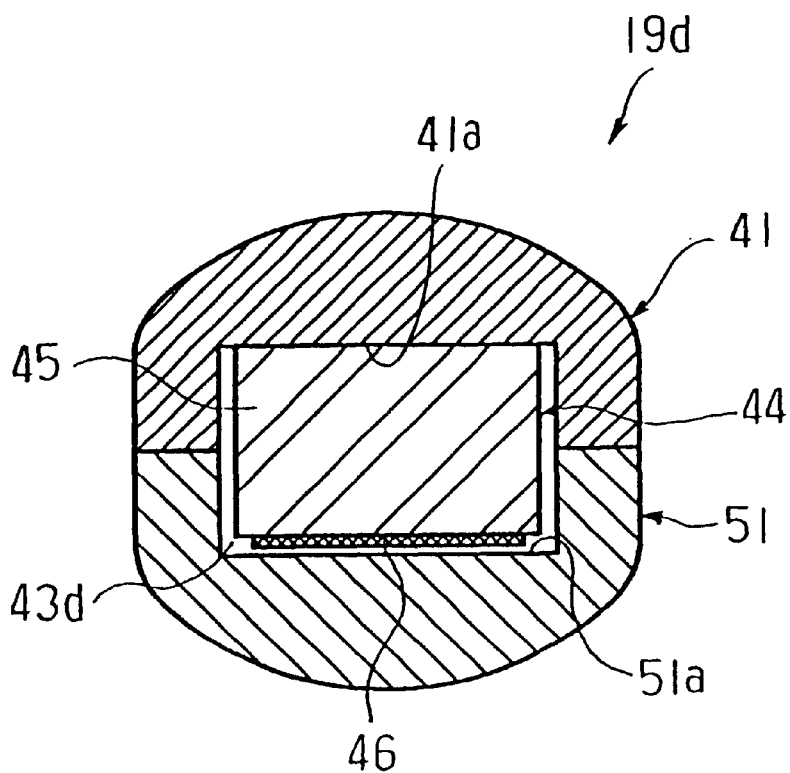

FIGS. 7(a) and 7(b) are sectional views of the rib parts 19b and 19c, respectively, in a state where the movement supporting member 40, casing ring 44, and movement holding member 50 are assembled. FIG. 7(a) is a sectional view taken along line 7(a)—7(a) of FIG. 2, and FIG. 7(b) is a sectional view taken along line 7(b)—7(b) of FIG. 2.

As shown in FIGS. 7(a) and 7(b), the rib 45 of the casing ring 44 is fit in both the path 41a of the rib 41 of the movement supporting member 40 and the path 51a of the rib 51 of the movement holding member 50, thereby preventing the movement supporting member 40 and the movement holding member 50 from rotating relative to each other.

Moreover, the winding stem 49 is provided through the inner path 43b of the rib part 19b in the position of 3 o'clock of the watch 20, and the sheet-type conduction pattern 46 for supplying the power of the solar cell 10 to the movement 42 is provided in the inner path 43d of the rib part 19d provided in the position of 9 o'clock of the watch 20. In the embodiment, the conduction pattern 46 serves as the conductive member. The conduction pattern 46 is adhered on the rib 45 of the casing ring 44 constructing the rib part 19d.

The winding stem 49 and the conduction pattern 46 may be provided in the separate rib parts 19b and 19d, respectively, as shown in FIGS. 7(a) and 7(b) or in the same rib part, for example, the rib part 19b to which the winding stem 49 is inserted.

In the embodiment, the movement supporting member 40, casing ring 44, and movement holding member 50 assembled as described above construct an inner casing. The inner casing is fit into the exterior casing 30 from below. After that, the ring-shaped pressing member 58 having a screw portion 58a is screwed in the exterior casing 30 via an O ring 57 from the lower side of the exterior casing 30.

By the operation, the movement supporting member 40, movement 42, casing ring 44, and movement holding member 50 are fixed in the exterior casing 30. At this time, the contacts 63 and 64 of the connection member 60 of the solar cell holding member 36 already assembled in the upper part of the exterior casing 30 come into contact with positive-side input terminal and negative-side input terminal (not shown) of the conductive pattern 46, so that the state where the power can be supplied from the solar cell 10 to the movement 42 is achieved.

On the back face of the movement 42, an identification plate 54 in which predetermined articles are written is adhered.

The windshield 56 on the back face side is fit in the opening of the ring-shaped pressing member 58 via a packing 59. The watch 20 of the embodiment has resistance to water, maintained by the O ring 57 and packings 35 and 59.

The windshield 56 may be fixed to the exterior casing 30 by, except for the packing 59, adhesive or the like.

In the watch completed in such a manner, the space portion 32 extending in the radial direction of the watch 20 and penetrating in the perpendicular direction are formed between the rib parts 19a to 19d provided in the positions of 3 o'clock, 6 o'clock, 9 o'clock, and 12 o'clock, respectively. Further, since the transparent windshield 56 is used also as the back of the watch 20, novel design in which the watch is see-through can be obtained.

In place of providing the solar cell 10 on the surface side of the watch 20, the solar cell 10 may be provided on the back side (windshield 56 side). Moreover, a solar cell similar to the solar cell 10 may be additionally provided on the back side (windshield 56 side).

Since light passed through the space portion 32 reaches also the back, the electromotive force can be obtained also by the solar cell provided on the back side.

Particularly, when the solar batteries are provided on both the surface and back sides, even if the electromotive force of the solar cell 10 on the surface side is reduced, the reduced amount can be compensated by the electromotive force of the solar cell on the back side. Consequently, the line width of the photocell 18 in the solar cell 10 can be further reduced, or the interval S is further widened, thereby enabling the solar cell 10 to be formed more transparently.

In the watch 20 of the embodiment, as shown in FIGS. 2 and 5, the diameter of the supporting portion 40a of the movement supporting member 40 is smaller than the length of each of the hour hand 24, minute hand 24, and second hand 28 of the watch 20, so that the tip of each of the pointers 24, 26, and 28 is projected from the supporting portion 40a and is seen from the back side of the watch 20. The scales 23 are provided in the transparent substrate 12 of the solar cell 10. Consequently, it is interesting for the user that time can be known also from the back side of the watch 20.

The invention is not limited to the analog timepiece but can be also applied to a digital timepiece.

Figure 8:
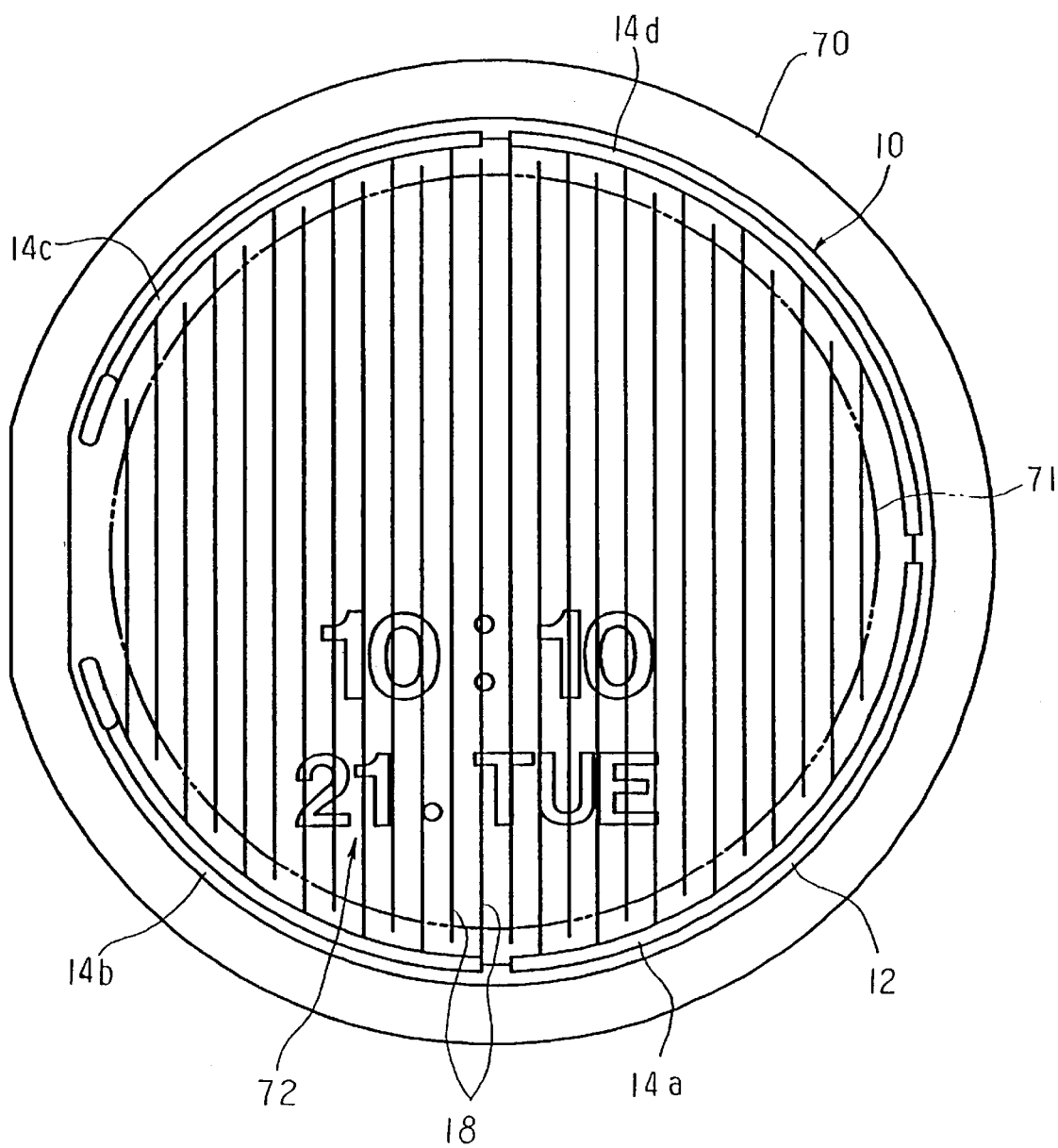
FIG. 8 is a plan view for explaining a second embodiment of the present invention.

FIG. 8 is a plan view of a second embodiment in which the present invention is applied to a digital watch. A digital display member 72 may be provided on a display plate 71 of a watch 70 or on the under face (back face) of the solar cell 10.

Moreover, the digital display member 72 may be formed directly on the transparent substrate 12 as a component of the solar cell 10. In this case, by using a polarizer as the transparent substrate 12, the polarizer of the digital display member 72 can be omitted.

Hereinafter, a third embodiment of the invention will be described by referring to FIGS. 9 to 11.

According to the third embodiment, when an electronic device such as a watch is on or is to be put on a human body, the solar cell 10 can be effectively protected from electrical shock such as static electricity or the like built on the human body.

It is said that the static electricity built on a human body reaches a few thousand volts (V). Consequently, there is a fear that the parts such as elements constructing a circuit of the electronic device or the clock function are partly destroyed while being carried. When the user wears the watch or tries to put the watch on his/her arm, there is a case such that static electricity is applied via the exterior casing 30 or windshield 34.

There is a fear that the static electricity enters the movement 42 or solar cell 10 of the watch through the exterior casing 30 and destroys an element or a circuit part.

Particularly, in the case where the photocells 18 are disposed near the windshield 34 exposed in the surface of the watch like the solar cell 10 of the present invention, the possibility of incurring electrical shock by the static electricity is high. Since the photocells 18 are formed by stacking thin films of silicon or the like in the solar cell 10, when static electricity of a few thousand volts is directly applied to the photocells 18, due to occurrence of a pin hole or the like by internal discharge, an element may be destroyed.

According to the embodiment, therefore, a transparent electrode film is formed on or near a cell substrate as a component of the solar cell 10 and the cell substrate is used for grounding. Hereinafter, it will be described in detail.

Figure 9:
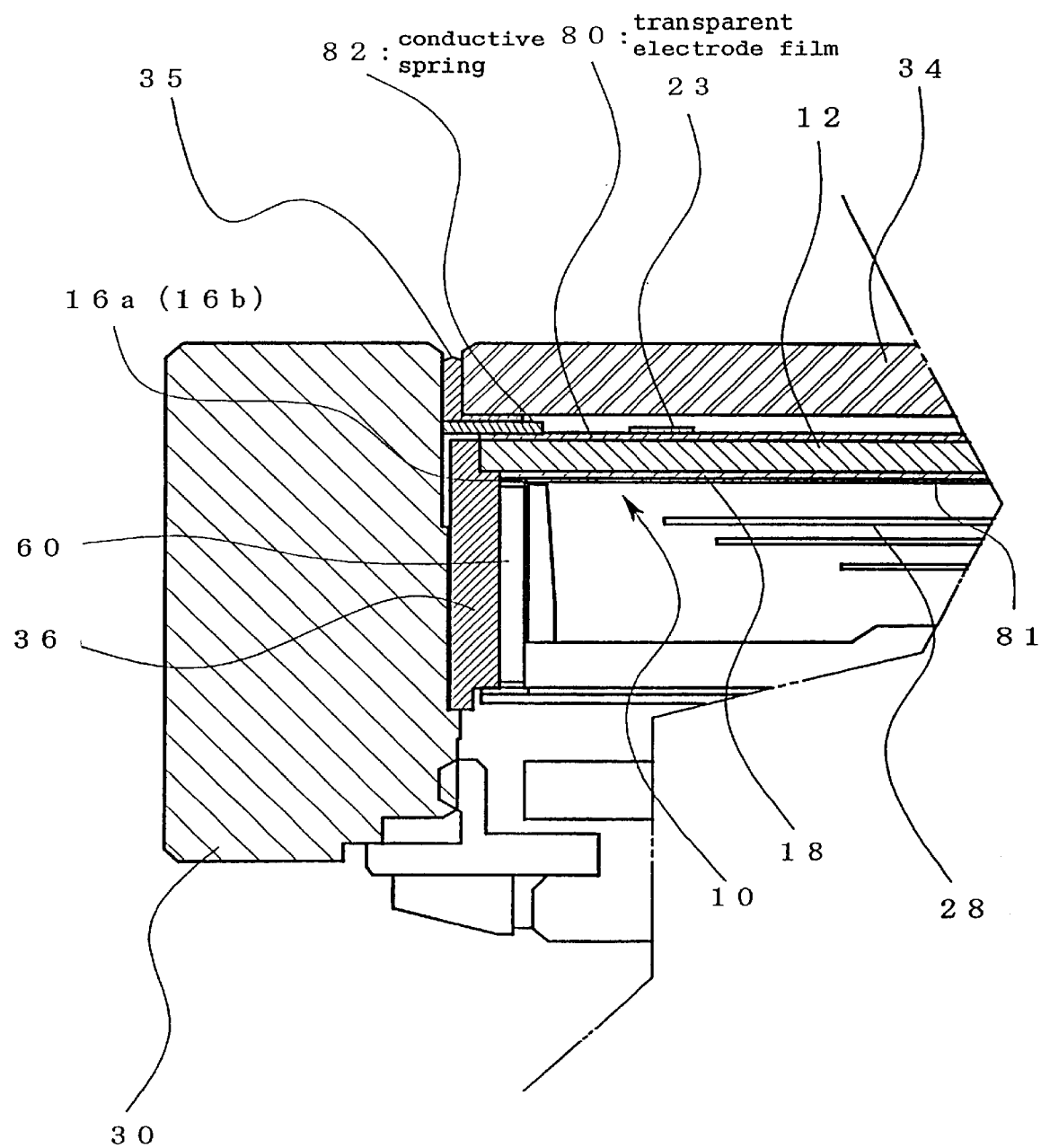
FIG. 9 is a sectional view taken along line 9—9 of FIG. 2, for explaining a third embodiment of the invention.
Figure 10:
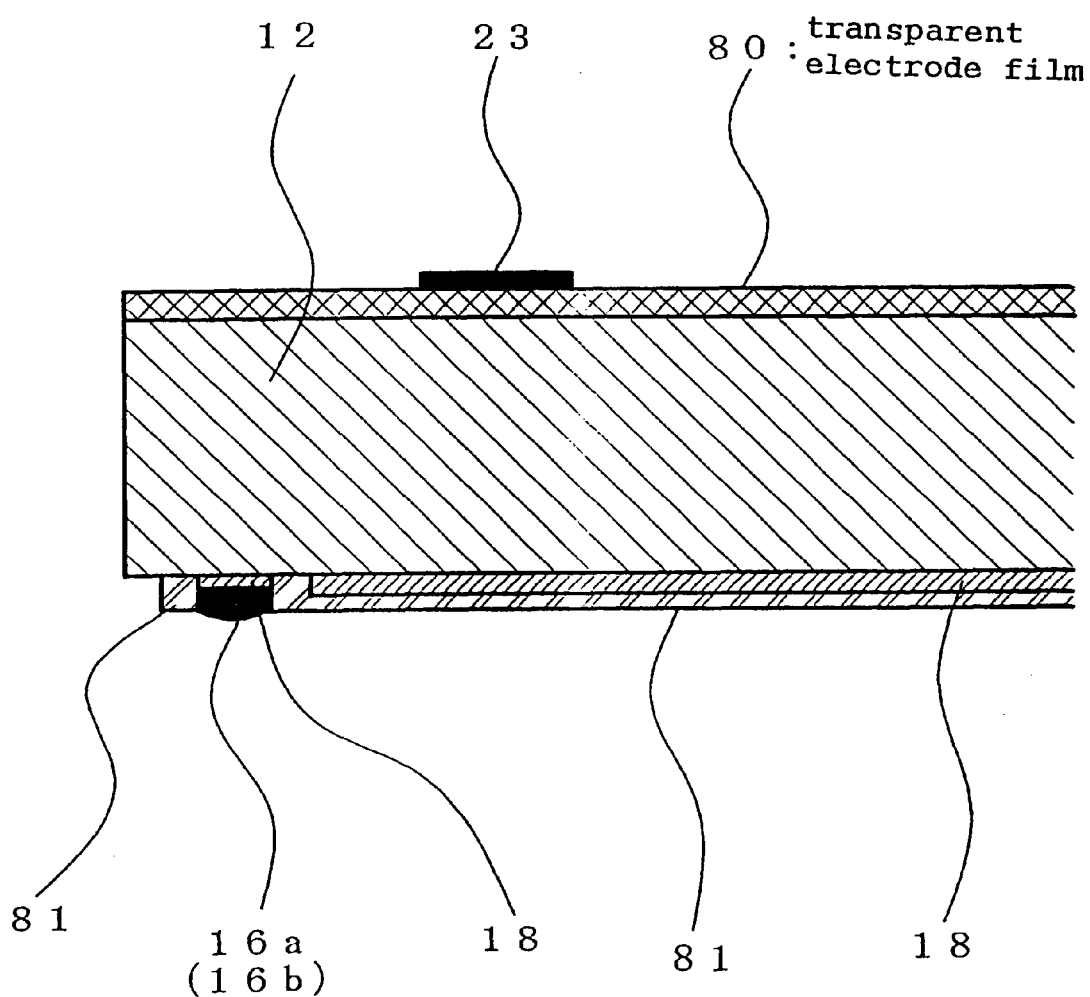
FIG. 10 is a partial sectional view of a solar cell according to the third embodiment.
Figure 11:
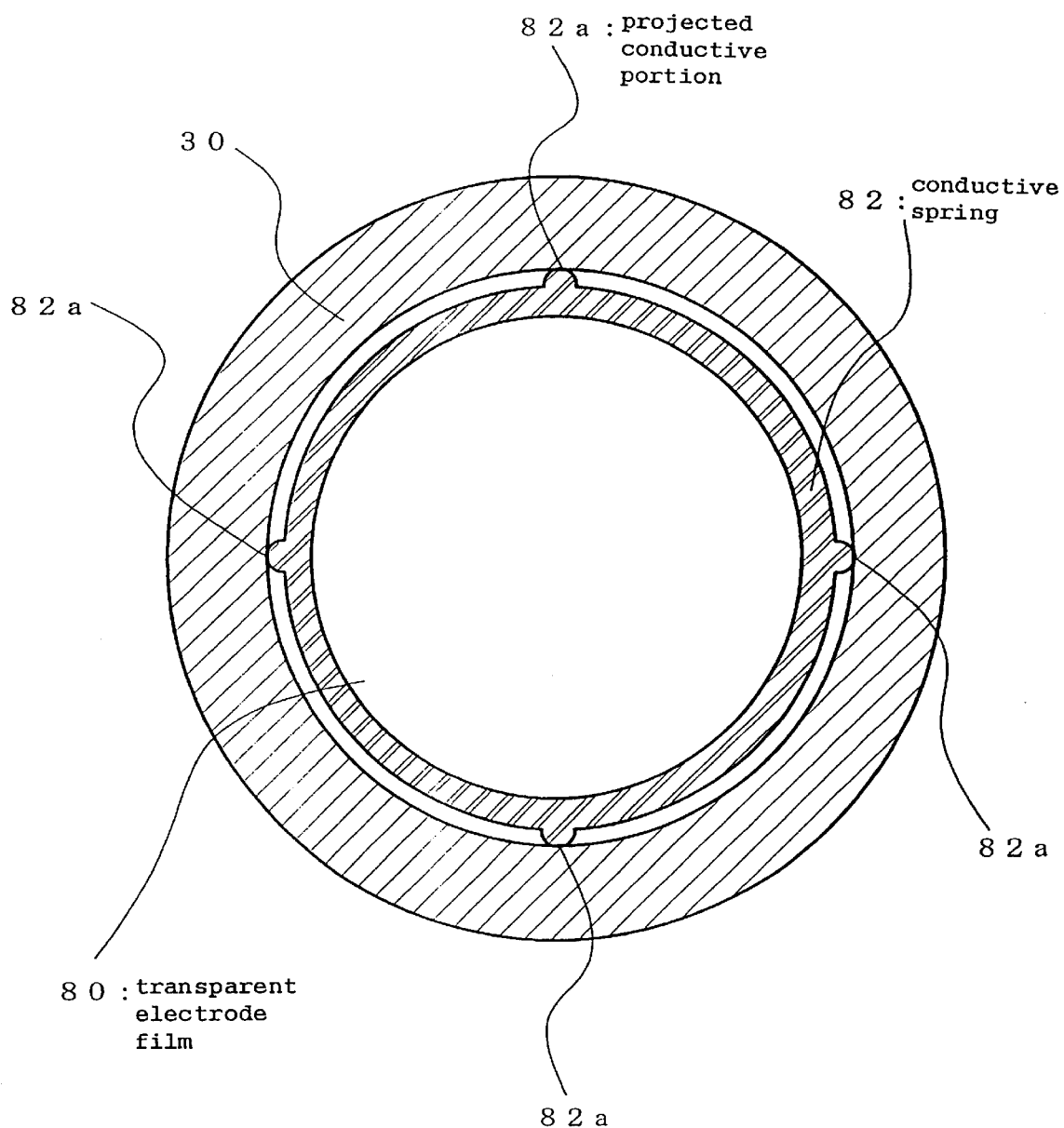
FIG. 11 is a plan view showing the shape of a conductive spring according to the third embodiment of the invention.

Since the basic configuration of an electronic device according to the embodiment is similar to that of the watch of the first embodiment shown in FIGS. 2 to 7, the same portions and the same members as those in FIG. 2 are designated by the same reference numerals in FIGS. 9 to 11 and their detailed description will not be repeated.

FIG. 9 is a sectional view taken along line 9—9 of FIG. 2. FIG. 10 is a sectional view showing the configuration of the solar cell 10 in the embodiment. FIG. 11 is a plan view showing the shape of a conductive spring.

As shown in FIG. 9, in the watch 20 of the embodiment, a transparent electrode film (ITO film) 80 is formed on the back of the transparent substrate 12 as a component of the solar cell 10, that is, the face opposite to the face on which the photocells 18 are formed. In the top face of the exterior casing 30, not only the windshield 34, packing 35, solar cell 10 and solar cell holding member 36 but also a conductive spring 82 are provided.

The scales 23 are provided on the transparent electrode film 80 and the solar cell 10 using the photocells 18 as elements is constructed on the face opposite to the scale 23 side.

The transparent electrode film 80 is generally called a T.C.O. (abbreviation of Transparent Conductive Oxide) and ITO (abbreviation of Indium Tin Oxide) film is defined in a part of it. The ITO film is made of a mixture of stannic oxide ($SnO_2$) and indium oxide ($InO_3$) and can be generated by spraying or painting a liquid obtained by mixing powder-state fine crystal in a binder, or a method of coating a crystal ionized by vapor deposition.

The thickness of a film generated is small, which is a few micrometers in the case of painting or is approximately 1000 to 2000 angstroms (approximately 0.01 to 0.02 micrometers) in the case of vapor deposition. The color is transparent but the no characteristics slightly change according to the thickness or the wavelength of transmission light. The thickness used in the present invention is in a range where the change of transmittance of light spectrum in the case of transparent color decreases approximately 10 percent, that is, in a range from 1000 to 2000 angstroms (approximately 0.01 to 0.02 micrometers). The conductivity indicative of conducting performance of the transparent electrode film 80 is used in a range from a few ohms to a few kΩ in a surface resistance value for the reason that a resistance value equal to or smaller than the resistance value of the photocell 18 of the solar cell 10 is necessary.

As shown in FIG. 10, on the photocell 18 side of the solar cell 10, a transparent protective film 81 made of acrylic resin or the like covering the whole photocell 18 is formed. The photocells 18 are partly exposed from the protective film 81 and output terminals 16a and 16b are formed in the portion. The output terminals 16a and 16b come into contact with the connection member 60 as shown in FIG. 9 so that the output of the solar cell 10 can be taken.

Further, on the side on which the transparent electrode film 80 is provided of the solar cell 10 of FIG. 9, the conductive spring 82 is provided so as to be in contact with the transparent electrode film 80 and is fixed by the windshield 34 via the packing 35.

The conductive spring 82 is made by a thin-plate metal member. Although not shown, the conductive spring 82 has a shape curved in the vertical direction of FIG. 9. By being pressed from above by the windshield 34 via the packing 35, the conductive spring 82 is in pressure contact with the transparent electrode film 80 of the solar cell 10 and becomes conductive.

Moreover, the conductive spring 82 has an annular ring shape as FIG. 11 shows its plane shape. The conductive spring 82 has a plurality of projected conductive portions 82a on the outer periphery. The maximum outside diameter of the conductive spring 82 including the plurality of conductive portions 82a is set to be larger than the inside diameter of the exterior casing 30. When the conductive spring 82 is assembled in the exterior casing 30, therefore, the conductive portions 82a of the conductive spring 82 are pressed against the inner face of the exterior casing 30, thereby making the transparent electrode film 80 and the exterior casing 30 enter an electrically conducting state.

Since the electronic device of the embodiment is constructed as described above, it acts as follows.

Even when static electricity is applied from the side of the exterior casing 30 of the watch, the windshield 34, or the side of the back made of plastic, the static electricity is discharged from the transparent electrode film 80 formed on the transparent substrate 12 of the solar cell 10 to the outside of the exterior casing 30 via the conductive spring 82 electrically connected to the exterior casing 30.

Specifically, the static electricity applied from the outside of the exterior casing 30, windshield 34, or the back made of plastic passes from the transparent electrode film 80 via the connection portion 82a of the conductive spring 82 conductive with the exterior casing 30 and returns to the exterior casing 30 before it is discharged to a part of the photocells 18 which are not conductive with the exterior casing 30. By the bypass effect, the solar cell 10 can be protected from a shock of the static electricity.

Moreover, as described above, when the conductivity indicative of conducting performance of the transparent electrode film 80 is expressed in a surface resistance value, it lies in a range from a few ohms to a few kΩ. The resistance value is equivalent or smaller than the resistance value of the photocell 18 of the solar cell 10, so that the configuration in which the static electricity can be discharged to the transparent electrode film 80 side more easily is achieved.

Although the third embodiment has been described on assumption that the transparent electrode film 80 is formed on the windshield 34 side of the transparent substrate 12 of the solar cell 10 and the solar cell 10 using the photocells 18 as elements is constructed on the movement 42 side, it is sufficient that an effect of bypassing the static electricity is obtained, so that the transparent electrode film 80 may be formed on the photocell 18 side via an insulating member. It may be formed on both surfaces including side faces of the transparent substrate. Further, it may be formed on the face of the windshield.

It is also possible to form a film-state transparent substrate on which the transparent electrode film 80 is formed separately from the transparent substrate 12 and dispose the substrate near the solar cell 10 so as to cover the entire solar cell 10. By forming the substrate in a ring shape so as to be conductive with the exterior casing 30, an equivalent effect can be obtained.

The third embodiment has been described on assumption that the transparent electrode film 80 is formed on the solar cell 10 having high transparency in which the thin-line-shaped photocells 18 are formed. However, also in a solar cell employing a generally used opaque film as a base and a solar cell formed on the entire face of a glass substrate, in most cases, the photocell is constructed by a silicon thin film. An adverse influence of the static electricity built on a human body and the like cannot be therefore denied. That is, in those cells as well, there is the danger that a pin hole or the like is generated by an electric shock of static electricity.

In order to protect the solar cell from the electric shock of the static electricity, it is preferable to provide a conductive member as a bypass.

In the solar cells, the transparent electrode film 80 as one of the conductive members may be constructed on the light incident side of the photocell 18 and the transparent electrode film 80 and the casing 30 serving as a ground are connected by using the conductive spring 82 or the like. With the configuration, there is an advantage that the flexibility of designing is increased.

Although the preferred embodiments of the present invention have been described, the invention is not limited to the foregoing embodiments.

For example, the watch has been described as an example of the electronic device, the present invention can be also applied to other timepieces such as a table clock and a wall clock. Further, the present invention can be applied to electronic devices other than timepieces.

Although only the analog and digital timepieces have been described, the present invention can be also applied to an analog/digital combination timepiece.

Although the embodiments have been described that the solar cell 10 using the transparent substrate 12 as a base material is provided under the windshield 34 of the watch 20, by forming the thin-line-shaped photocells 18 directly on the windshield 34, the thickness of the watch 20 can be reduced.

Further, the cell substrate as a component of the solar cell has been described as an entirely transparent substrate. However, it is sufficient that at least the portion in which the photocells are formed is transparent, and the peripheral portion in which the conductive portions are formed may be opaque.

According to the present invention, by extremely narrowing the photocell and providing the photocell so as to be transverse almost the entire face of the display member, the transparency of the solar cell can be improved. By using such a translucent solar cell, the flexibility in designing electronic devices, particularly, timepieces can be largely improved.

Moreover, by forming a space extending in the radial direction of a timepiece and penetrating in the perpendicular direction and by using a transparent glass also as the back of the timepiece, a see-through timepiece in novel design can be attained and the user's fashion mind can be satisfied.

Moreover, when the transparent electrode film is formed on or near the cell substrate and grounding is made via the transparent electrode film to the exterior casing or the like, the electronic device can be protected from external environments such as static electricity built on a human body, so that a durable electronic device can be provided.

Industrial Applicability

The present invention is not limited to a watch but can be applied to electronic devices, each operating on a solar cell as a power source, of kinds in a wide range small communication devices such as a portable telephone and a portable radio, and a pedometer, a portable hemadynamometer, a radio and the like.

What is claimed is:

1. An electronic device comprising:
   a unit including a display member to display data, and a cover surrounding the display member and having an inner area, and
   a translucent solar cell connected to the unit for generating power to drive the unit and including a transparent cell substrate having an outer area greater than the inner area of the cover; a plurality of conductive portions provided at the outer area on the cell substrate around the display member and connected in series so that the conductive portions are concealed by the cover; and a plurality of photocells, each having a thin-line shape, formed at intervals on the cell substrate and connected to the conductive portions.

2. The electronic device according to claim 1, wherein the photocells each having a thin-line shape are formed on the cell substrate at regular intervals.

3. The electronic device according to claim 1, wherein each photocell having the thin-line shape is formed so as to extend from one of the conductive portions in a direction crossing the cell substrate.

4. The electronic device according to claim 3, wherein each photocell having the thin-line shape extends so as to cross the cell substrate to a position near a corresponding conductive portion to have a gap between the photocell and the corresponding conductive portion, said gap being located outside the display member.

5. The electronic device according to claim 1, wherein the photocells are connected to the conductive portions so that same electromotive force is obtained from each of the plurality of conductive portions.

6. The electronic device according to claim 5, wherein the photocells are connected to the conductive portions so that total areas of the photocells connected to each conductive portion are equal to each other.

7. The electronic device according to claim 1, wherein each photocell of the thin-line shape has a width in a range from 3% to 30% of an interval.

8. The electronic device according to claim 1, wherein a part of the conductive portions is formed as an output terminal for supplying power from the translucent solar cell to the unit.

9. The electronic device according to claim 1, wherein the translucent solar cell is disposed on an upper side of the display member.

10. The electronic device according to claim 9, wherein the display member includes a liquid crystal display.

11. The electronic device according to claim 9, wherein the display member is provided on a back face of the cell substrate.

12. The electronic device according to claim 1, wherein the translucent solar cell is disposed on an upper side of a casing of the electronic device, the unit is disposed below the translucent solar cell in the casing, a space is provided between the unit and the casing, and a transparent member is disposed under the electronic device so that the electronic device is see-through.

13. The electronic device according to claim 1, wherein the translucent solar cell is disposed on a lower side of a casing or the translucent solar cell is disposed on upper and lower sides of the casing.

14. The electronic device according to claim 1, wherein the electronic device is a timepiece and the display member includes a time display member indicating time.

15. The electronic device according to claim 14, wherein the display member includes an analog display member for displaying time by pointers and a dial, and the translucent solar cell is provided above the dial.

16. The electronic device according to claim 15, wherein the cell substrate is larger than an outer periphery of a movement for driving the pointers of the analog display member.

17. The electronic device according to claim 15, wherein the translucent solar cell is provided above the pointers.

18. The electronic device according to claim 15, wherein a scale of the dial is provided on a back of the cell substrate.

19. The electronic device according to claim 14, wherein the cell substrate is a windshield of the timepiece.

20. The electronic device according to claim 15, wherein the translucent solar cell is disposed on a surface of a casing of the timepiece, the pointers of the analog display member and a movement for driving the pointers are disposed below the translucent solar cell in the casing, a space is provided between the movement and the casing, and a transparent plate is disposed on an under face side of the timepiece so that the timepiece is see-through.

21. The electronic device according to claim 20, wherein another translucent solar cell is disposed on a back side of the casing.

22. The electronic device according to claim 20, wherein the casing and the movement are coupled to each other via at least one rib, and the movement is supported on a center side of the casing.

23. The electronic device according to claim 22, wherein the casing has an exterior casing and an inner casing fit in the exterior casing, and the at least one rib is formed in the inner casing.

24. The electronic device according to claim 22, wherein a conductive member for supplying the power from the translucent solar cell to the movement through the inside of the at least one rib is disposed.

25. The electronic device according to claim 22, wherein a winding stem is provided so as to be inserted in the at least one rib.

26. The electronic device according to claim 24, wherein the conductive member is provided through a rib different from the at least one rib through which a winding stem is inserted.

27. The electronic device according to claim 24, wherein one of the conductive portions on the cell substrate and the conductive member are connected to each other via a connection member, and this connection member has a first contact portion abutted against an output terminal of the one of the conductive portions, and a second contact portion abutted against the conductive member.

28. The electronic device according to claim 27, wherein the solar cell is held in a solar cell holding member fit in the casing, the connection member is provided for the solar cell holding member, the first contact portion comes into contact with an output terminal of the one of the conductive portions of the solar cell in a receiving portion of the solar cell holding member for receiving the solar cell, and the second contact portion comes into contact with the conductive member when the solar cell holding member is housed in the casing.

29. The electronic device according to claim 20, wherein at least a minute hand indicating minute out of the pointers of the analog display member is extended to a position above the space provided between the casing and the movement.

30. The electronic device according to claim 14, wherein the translucent solar cell is made larger than that of the display member.

31. The electronic device according to claim 15, wherein a portion having an inside diameter smaller than that of the cell substrate is provided in a casing, and the plurality of conductive portions provided for the cell substrate is hidden by this portion.

32. The electronic device according to claim 1, wherein a transparent electrode film is formed on or near the cell substrate, and the transparent electrode film is connected to a ground of the unit.

33. The electronic device according to claim 32, wherein the transparent electrode film is formed on a side opposite to a face, on which the photocells are formed, of the cell substrate.

34. The electronic device according to claim 33, wherein the transparent electrode film is formed on a substrate face opposite to a face, on which the plurality of photocells is formed, of the cell substrate.

35. The electronic device according to claim 32, wherein the transparent electrode film is formed on a side of a face, on which the plurality of photocells is formed, of the cell substrate.

36. The electronic device according to claim 32, wherein the transparent electrode film is grounded to a casing via a conductive member.

37. The electronic device according to claim 32, wherein the transparent electrode film is a transparent ITO thin film.

* * * * *